(12) United States Patent
Mitlin et al.

(10) Patent No.: US 7,137,047 B2
(45) Date of Patent: Nov. 14, 2006

(54) METHOD AND APPARATUS FOR SELECTION OF ARQ PARAMETERS AND ESTIMATION OF IMPROVED COMMUNICATIONS

(75) Inventors: Vlad Mitlin, San Diego, CA (US); A. Joseph Mueller, San Diego, CA (US)

(73) Assignee: 3Com Corporation, Marlborough, MA (US)

( * ) Notice: Subject to any disclaimer, the term of this patent is extended or adjusted under 35 U.S.C. 154(b) by 374 days.

(21) Appl. No.: 10/818,250

(22) Filed: Apr. 5, 2004

(65) Prior Publication Data

US 2004/0193972 A1 Sep. 30, 2004

Related U.S. Application Data

(63) Continuation of application No. 09/859,867, filed on May 17, 2001, now Pat. No. 6,718,493.

(51) Int. Cl.
*G06F 11/00* (2006.01)

(52) U.S. Cl. ........................ 714/704; 714/752; 714/786

(58) Field of Classification Search ............... 704/229; 375/316, 260; 370/468; 455/249.1; 714/704, 714/752, 786
See application file for complete search history.

(56) References Cited

U.S. PATENT DOCUMENTS

| | | | |
|---|---|---|---|
| 5,399,891 A | 3/1995 | Yiu et al. | |
| 5,479,447 A | 12/1995 | Chow et al. | |
| 5,511,079 A | 4/1996 | Dillon | |
| 5,596,604 A * | 1/1997 | Cioffi et al. | ........... 375/260 |
| 5,600,663 A | 2/1997 | Ayanoglu et al. | |
| 5,677,927 A | 10/1997 | Fullerton et al. | |
| 5,699,365 A | 12/1997 | Klayman et al. | |
| 5,699,369 A | 12/1997 | Guha | |
| 5,737,337 A | 4/1998 | Voith et al. | |
| 5,742,640 A | 4/1998 | Haoui et al. | |
| 5,751,741 A | 5/1998 | Voith et al. | |
| 5,828,677 A | 10/1998 | Sayeed et al. | |
| 5,852,633 A | 12/1998 | Levin et al. | |
| 5,896,391 A | 4/1999 | Solheim et al. | |
| 5,907,563 A | 5/1999 | Takeuchi et al. | |
| 5,946,346 A | 8/1999 | Ahmed et al. | |
| 6,002,671 A | 12/1999 | Kahkoska et al. | |
| 6,005,893 A | 12/1999 | Hyll | |
| 6,034,996 A | 3/2000 | Herzberg | |
| 6,064,692 A | 5/2000 | Chow | |
| 6,072,779 A | 6/2000 | Tzannes et al. | |
| 6,075,821 A | 6/2000 | Kao et al. | |
| 6,088,387 A | 7/2000 | Gelblum et al. | |
| 6,088,390 A | 7/2000 | Russell et al. | |
| 6,092,230 A | 7/2000 | Wood et al. | |
| 6,101,223 A | 8/2000 | Betts | |
| 6,128,763 A | 10/2000 | LoGalbo et al. | |
| 6,130,882 A | 10/2000 | Levin | |
| 6,163,766 A * | 12/2000 | Kleider et al. | ........... 704/229 |
| 6,222,888 B1 | 4/2001 | Kao et al. | |
| 6,236,674 B1 | 5/2001 | Morelli et al. | |

(Continued)

OTHER PUBLICATIONS

Dimitri Bertsekas and Robert Gallager, "Data Networks," 1992, pp. 64-86 and 149-241, Pretice Hall, Upper Saddle River, NJ, USA.

(Continued)

*Primary Examiner*—David Ton

(57) ABSTRACT

The present invention includes a method for selecting appropriate forward error correction and automatic repeat request parameters for protection of a multicarrier communication channel. The multicarrier communication channel may be wired or wireless. Particular aspects of the present invention are described in the claims, specification and drawings.

11 Claims, 2 Drawing Sheets

U.S. PATENT DOCUMENTS

| | | | |
|---|---|---|---|
| 6,249,543 | B1 | 6/2001 | Chow |
| 6,353,627 | B1 | 3/2002 | Schilling |
| 6,363,109 | B1 | 3/2002 | Polley et al. |
| 6,370,669 | B1 | 4/2002 | Eroz et al. |
| 6,441,931 | B1 | 8/2002 | Moskovich et al. |
| 6,445,773 | B1 | 9/2002 | Liang et al. |
| 6,449,288 | B1 | 9/2002 | Chari et al. |
| 6,459,678 | B1 | 10/2002 | Herzberg |
| 6,466,629 | B1 * | 10/2002 | Isaksson et al. ............ 375/316 |
| 6,473,438 | B1 * | 10/2002 | Cioffi et al. ................ 370/468 |
| 6,477,669 | B1 | 11/2002 | Agarwal et al. |
| 6,493,402 | B1 | 12/2002 | Fimoff |
| 6,516,027 | B1 | 2/2003 | Kapoor et al. |
| 6,529,558 | B1 | 3/2003 | Fimoff et al. |
| 6,571,089 | B1 | 5/2003 | Richards et al. |
| 6,574,769 | B1 | 6/2003 | Ramaswamy et al. |
| 6,598,188 | B1 | 7/2003 | Locke et al. |
| 6,611,564 | B1 | 8/2003 | Linz et al. |
| 6,625,777 | B1 | 9/2003 | Levin et al. |
| 6,735,423 | B1 * | 5/2004 | Uskali et al. ............ 455/249.1 |
| 6,907,553 | B1 * | 6/2005 | Popplewell et al. ........ 714/704 |
| 7,003,044 | B1 * | 2/2006 | Subramanian et al. ...... 375/260 |
| 2003/0066005 | A1 | 4/2003 | Iglesia et al. |

OTHER PUBLICATIONS

John A. C. Bingham, "Multicarrier Modulation for Data Transmission: An Idea Whose Time Has Come," IEEE Communications Magazine, May 1990, pp. 5-14.

Walter Y. Chen, "DSL: Simulation Techniques and Standards Development for Digital Subscriber Line Systems," 1998, pp. 465, 11, and 119-121, MacMillan Technical Publishing, Indianapolis, IN, USA.

Peter Sienpin Chow, "Bandwidth Optimized Digital Transmission Technqiues for Spectrally Shaped Channels with Impulse Noise," Ph.D. Thesis, Stanford University, May 1993, pp. ii-187.

Peter S. Chow, John M. Cioffi, and John A. C. Bingham, "A Practical Discrete Multitone Transceiver Loading Algorithm for Data Transmission over Spectrally Shaped Channels," IEEE Transactions on Communications, Feb./Mar./Apr. 1995, pp. 773-775.

N. G. de Bruijn, "Asymptotic Methods in Analysis," 1981, pp. 22-23, Dover Publications, Inc., New York, NY, USA.

F. J. MacWilliams and N. J. A. Sloane, "Reed-Solomon and Justesen codes," The Theory of Error-Correction Codes, 1977, p. 306, Elsevier Science.

Vladimir S. Mitlin, "Nonlinear Dynamics of Reservoir Mixtures," 1993, pp. 173-177, CRC Press.

William H. Press, Saul A. Teukolsky, William T. Vetterling, and Brian P. Flannery, "Numerical Recipes in C—The Art of Scientific Computing, Second Edition," 1992, pp. 212-221, Cambridge University Press.

Ohn G. Proakis, "Digital Communications," 1995, pp. 260-263, 278-282, 441, and 464-467, McGraw-Hill, Inc., New York, NY, USA.

ITU-T Recommendation G.992.1: Asymmetric Digital Subscriber Line (ADSL) Transceivers, 1999, pp. i-240, Geneva.

ITU-T Recommendation G.992.2: Splitterless Asymmetric Digital Subscriber Line (ADSL) Transceivers, 1999, pp. i-165, Geneva.

Otnes et al., "Adaptive Data Rate Using ARQ and Nonuniform Constellations", Vehicular Technology Conference, 2001. IEEE VTS 53rd, pp. 1211-1215.

* cited by examiner

METHOD AND APPARATUS FOR SELECTION OF ARQ PARAMETERS AND ESTIMATION OF IMPROVED COMMUNICATIONS

RELATED APPLICATION DATA

The present application is a continuation of application Ser. No. 09/859,867, filed 17 May 2001, entitled "Method and Apparatus for Selection of ARQ Parameters and Estimation of Improved Communications", issuing on 6 Apr. 2004 as U.S. Pat. No. 6,718,493, which is incorporated by reference as if fully set forth herein.

The present application is related to co-pending application Ser. No. 09/689,367, filed 12 Oct. 2000, entitled "Method of Selecting Initialization Parameters for Multi-Channel Data Communication with Forward Error Correction"; and also related to co-pending application Ser. No. 09/742,686, filed 20 Dec. 2000, entitled "Performance Evaluation of a G.dmt-Compliant Digital Subscriber Line System"; and also related to co-pending application Ser. No. 09/741,639, filed 20 Dec. 2000, entitled "Performance Evaluation of Multicarrier Channels with Forward Error Correction and Automatic Retransmission Request"; and also related to co-pending application Ser. No. 09/741,636, filed 20 Dec. 2000, entitled "Performance Evaluation of Multicarrier Channels"; all of which are owned by the same assignee now and at the time of invention, and all of which are incorporated by reference as if fully set forth herein.

BACKGROUND OF THE INVENTION

High-speed communication channels are available for wired and wireless communication. Forward error correction (FEC) codes, such as the Reed Solomon code, often protect high-speed channels. FEC codes work well to protect against random white noise, but less effectively against burst noise. In some circumstances, an automatic repeat request (ARQ) protocol provides much better channel protection than FEC by itself. When ARQ is enabled, the parameters for channel protection can be adjusted accordingly. Standards which enable the use of ARQ do not specify values for applicable parameters; standards leave the operating parameters open, to be adapted to circumstances.

Therefore, it is desirable to introduce the method and device for selecting parameters to be used when ARQ is enabled for channel protection.

SUMMARY OF THE INVENTION

The present invention includes a method for selecting appropriate forward error correction and automatic repeat request parameters for protection of a multicarrier communication channel. The multicarrier communication channel may be wired or wireless. Particular aspects of the present invention are described in the claims, specification and drawings.

DETAILED DESCRIPTION

Figure 1:
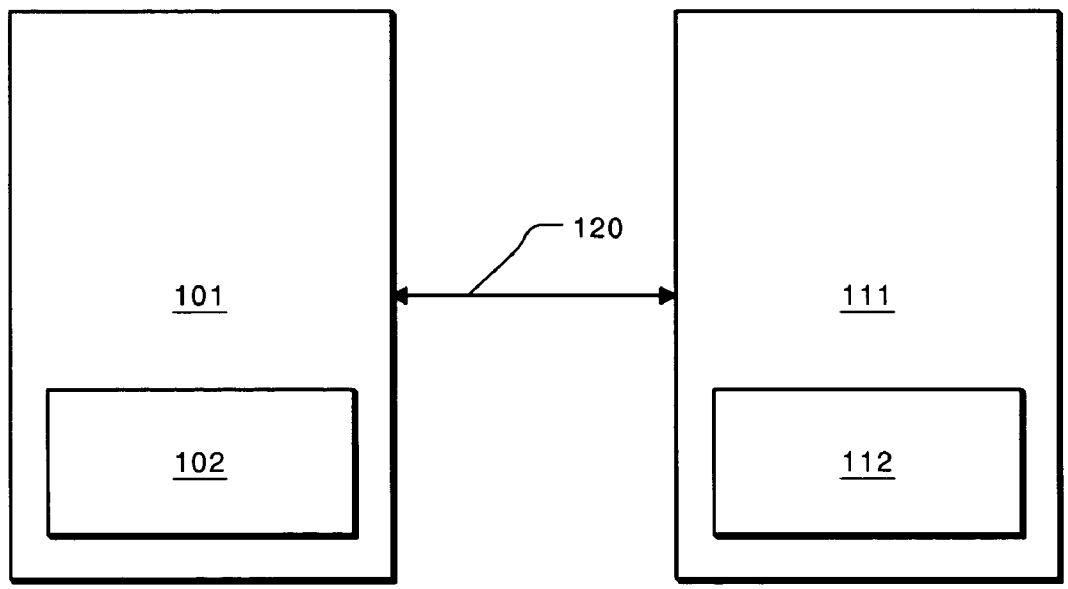
FIG. 1 is a block diagram of a system which may practice aspects of the present invention.

The following detailed description is made with reference to the figures. Preferred embodiments are described to illustrate the present invention, not to limit its scope, which is defined by claims drawn for the specification, including its description figures and original claims. Those of ordinary skill in the art will recognize a variety of equivalent variations on the description that follows.

1. Introduction

This invention presents a set of quantitative methods for the ARQ—(Automatic Repeat Request Protocol) related margin adjustment in setting error control parameters in discrete multi-tone (DMT) and orthogonal frequency division multiplexing (OFDM) transceivers. The discussion presented below for a DMT system is equally valid for an OFDM system.

First, for a DMT transceiver, we formulate a quantitative method of estimating BER as a function of the signal-to-noise ratio (SNR) applied in the presence of forward error correction (FEC) and ARQ.

Next, we formulate a method of trading off the level of margin applied to the SNR distribution measured by a DMT receiver and the maximum number of transmissions allowed. In other words, we show that a multicarrier transceiver using some margin and a maximum number of transmissions allowed (which includes the first transmission and the subsequent re-transmissions, for a given FEC frame) k, is equivalent (BER-wise) to a transceiver using lower margin and higher k. Particularly, a multicarrier system without ARQ characterized by some margin is equivalent (BER-wise) to a system with ARQ and with lower margin. We derive an explicit relationship between increasing the k value and a margin decrease (or the line ARQ gain) it allows one to achieve.

We discuss the distinction between the line ARQ gain and the net ARQ gain, the first related to the total increase in data transmission, the second discounted for FEC redundancy and re-transmissions. We show that unlike the line ARQ gain growing monotonically with increasing k, the net ARQ gain attains a maximum at certain $k_{opt}$ (the optimum allowable number of transmissions). A systematic procedure of simultaneously adjusting the bit load, throughput, and k values in initializing multicarrier transceivers is proposed.

Finally, we prove that for given bit load and FEC parameters, the difference between the channel SNR and the line ARQ gain maximizing channel throughput is independent of the channel SNR value. Based on this important result, we formulate a simple and efficient method of determining the optimum ARQ parameters at the actual channel conditions, based on their values at some reference conditions, the latter being either stored in the modem memory or pre-calculated prior to channel initialization.

The methodology proposed is quite general and is therefore applicable to modem transceivers operating over both wired (G.lite or ITU G.992.2- and G.dmt or ITU G.992.1-compliant transceivers) and wireless (for instance, IEEE 802.11a- and 802.16-compliant transceivers) channels.

2. Background

A communication channel with FEC and ARQ can be described, as follows.

In a communication protocol with ARQ, the data transmission between two stations consists of exchanging information and acknowledgement frames. The error-controlling algorithm may be a combination of a forward error correction and a cyclic redundancy check (CRC). Each information frame has an information field, a CRC field, and a control field. The length of the control field depends on the number of errors that FEC is designed to correct, i.e. the larger is the number of correctable errors the longer is the control field. Each acknowledgement frame has the length that is typically much smaller than the length of the information frame.

If an information frame is correctable by FEC a positive acknowledgement frame will be sent to the peer. For any non-correctable frame, the CRC will detect the residual errors left after FEC, and a negative acknowledgement frame will be sent to the peer. These acknowledgement frames may be sent after each information frame or accumulated for several information frames. Then the non-correctable information frame may be retransmitted if the maximum allowed number of transmissions has not been reached for that frame.

In multicarrier systems the modem transforms digital information into an analog form (a DMT symbol or, as it is commonly called in wireless applications, an OFDM symbol) that is essentially a superposition of harmonic signals generated by a set of individually modulated sub-channels (bins). Each DMT symbol bears information in the form of an array of zeroes and ones, consisting of several $b_i$-sized sub-arrays. Each sub-array corresponds to a QAM waveform representing a $2^{b_i}$-point constellation. A DMT symbol waveform is just the superposition of these waveforms. The channel itself is characterized by $\{\gamma_i\}$ where $\gamma_i$ is the signal-to-noise ratio (SNR) at the $i^{th}$ carrier frequency.

As the DMT symbol rate is fixed for a multicarrier channel, maximizing the number of bits per DMT symbol is equivalent to maximizing the channel throughput. Equations for determining the maximum bit load of each subcarrier in a multicarrier DMT system with FEC at the BER of E have the following form:

$$1 - \left(1 - W \cdot \varepsilon_S^{\frac{1}{(0.5R+1)k}}\right)^{1/\alpha} = \qquad (2.1)$$

$$\omega(b)(1 - 2^{-b/2})\mathrm{erfc}\left(\sqrt{3 \cdot 10^{\gamma/10}/(2^{b+1}-2)}\right)\left[2 - (1 - 2^{-b/2})\mathrm{erfc}\left(\sqrt{3 \cdot 10^{\gamma/10}/(2^{b+1}-2)}\right)\right]$$

$$\varepsilon_S = 1 - \left(1 - \frac{\varepsilon}{\beta}\right)^\alpha, \varepsilon_S = \alpha\frac{\varepsilon}{\beta} \text{ for small } \varepsilon, \qquad (2.2)$$

$$W = \left[\frac{\Gamma(K+\rho S+R)}{\Gamma(K+\rho S+0.5\cdot R)\Gamma(0.5\cdot R+1)}\right]^{-1/(0.5\cdot R+1)k} \qquad (2.3)$$

$$\left[\frac{\Gamma(K+\rho S+R+1)}{\Gamma(K+\rho S+0.5\cdot R)\Gamma(0.5\cdot R+2)}\right]^{-(k-1)/(0.5\cdot R+1)k}$$

$$\omega = \frac{4}{3+2b} \qquad (2.4)$$

$\Gamma$ is the gamma-function; $\mathrm{erfc}(x) = \frac{2}{\sqrt{\pi}}\int_x^\infty \exp(-y^2)\,dy;$ $\alpha$ is the bit size of a FEC code symbol; $\beta$ is the descrambler constant (number of nonzero coefficients in the descrambler polynomial); $\gamma$ is the signal-to-noise ratio in dB; $\rho$ is the number of overhead code symbols per DMT symbol not including FEC control code symbols; b is the bit load of a subcarrier; S is the number of DMT symbols per FEC frame; R is the number of FEC control code symbols per FEC frame; K is the number of information code symbols in a FEC frame; k is the maximum allowable number of transmissions; $\varepsilon_s$ is the code symbol error rate (SER) after FEC and ARQ; and $\omega(b)$ is an average fraction of erroneous bits in an erroneous b-sized QAM symbol (see Additional Discussion section for details). In one special and frequently encountered case, involving G.lite and G.dmt default framing mode 3, with merged fast and sync bytes, $\rho$ is equal to 1. Eq. 2.4 is specially adapted to G.lite and G.dmt. For 806.11a and 802.16, the corresponding equation would be $\omega=1/b$.

It was shown in U.S. patent application Ser. No. 09/741,636 that if the bit load of each subcarrier is determined from Eq. (2.1) then for not a very poor quality of a channel (SNRG≅15 dB or larger, for each carrier), Eq. (2.1) also describes the relationship between an average bit load of a multicarrier system, $$b(\gamma_{\textit{eff}}) = \frac{B_{DMT}}{n_{\textit{eff}}}, B_{DMT} = \sum_{\substack{i=1,\\ \gamma_i>\gamma_*}}^{n_{\textit{eff}}} b(\gamma_i) \qquad (2.5)$$

and the average SNR of the channel, $$\gamma_{\textit{eff}} = \frac{1}{n_{\textit{eff}}}\sum_{\gamma_i>\gamma_*} \gamma_i, \qquad (2.6)$$

In Eqs. (2.5) and (2.6) $B_{DMT}$ is the size of a DMT symbol, $n_{\textit{eff}}$ is the total number of data capable carriers, $$n_{\textit{eff}} = \sum_{\gamma_i>\gamma_*} 1, \qquad (2.7)$$

and $\gamma^*$ is the threshold level of SNR below which information cannot be passed reliably through the channel.

For a given BER, to determine the bit load of an individual carrier or an average bit load over all subcarriers, Eq. (2.1) has to be solved numerically. That was done U.S. patent application Ser. Nos. 09/741,636 and 09/741,639, the FEC/ARQ parameters corresponding to the maximum channel throughput have been determined for G.lite and G.dmt (ITU standards G.992.2 and G.992.1, respectively) compliant modems.

To alleviate the effect of burst errors impacting a communications channel, usually, an additional margin of 4 dB or more is applied against the SNR distribution over the sub-channels. Using ARQ and FEC for data correction allows one to decrease this margin. This is equivalent to an increase in the channel throughput due to the "ARQ gain".

3. BER vs. SNR Dependence for a Multicarrier Transceiver

Consider a multicarrier transceiver with properties described by Eqs. (2.1)–(2.7). These equations were used in the applications incorporated by reference to find b as a function of SNR and FEC/ARQ parameters. Below a different problem will be considered, i.e. finding BER as a function of b, SNR, and FEC/ARQ parameters.

As BER<<1 and assuming that the SER before FEC and ARQ is much smaller than unity $$W \cdot \varepsilon_S^{\frac{1}{(0.5R+1)k}} \ll 1,$$

the expression on the right hand side of Eq. (2.1) can be simplified which yields:

$$\frac{W}{\alpha}\left(\frac{\alpha\varepsilon}{\beta}\right)^{\frac{1}{(0.5R+1)k}} = \frac{4(1-2^{-b/2})}{(3+2b)}\mathrm{erfc}\left(\sqrt{3\cdot 10^{\gamma/10}/(2^{b+1}-2)}\right)\left[2-(1-2^{-b/2})\mathrm{erfc}\left(\sqrt{3\cdot 10^{\gamma/10}/(2^{b+1}-2)}\right)\right] \quad (3.1)$$

Equation (3.1) yields the following expression for BER:

$$\varepsilon = \frac{\beta}{\alpha}\left[\frac{4\alpha(1-2^{-b/2})}{W(t,K,k)(3+2b)}\mathrm{erfc}\left(\sqrt{3\cdot 10^{\gamma/10}/(2^{b+1}-2)}\right) \times \left(2-(1-2^{b/2})\mathrm{erfc}\left(\sqrt{3\cdot 10^{\gamma/10}/(2^{b+1}-2)}\right)\right)\right]^{(0.5R+1)k} \quad (3.2)$$

Equation (3.2) relates BER in the channel output (after FEC and ARQ) to the average bit load, average SNR, FEC parameters, and the maximum allowed number of transmissions. Introducing the BER exponent, $$\epsilon = \exp(-\chi) \quad (3.3)$$

and using Eq. (2.3) yields the following equivalent of Eq. (3.2):

$$\chi = -\ln\frac{\beta}{\alpha} - \ln\left[\frac{\Gamma(K+\rho S+R)}{\Gamma(K+\rho S+0.5R)\Gamma(0.5R+1)}\right] - \quad (3.4)$$

$$(k-1)\ln\left[\frac{\Gamma(K+\rho S+R+1)}{\Gamma(K+\rho S+0.5R)\Gamma(0.5R+2)}\right] -$$

$$(0.5R+1)k\ln\left[\frac{4\alpha(1-2^{-b/2})}{(3+2b)}\mathrm{erfc}\left(\sqrt{3\cdot 10^{\gamma/10}/(2^{b+1}-2)}\right) \times \left(2-(1-2^{b/2})\mathrm{erfc}\left(\sqrt{3\cdot 10^{\gamma/10}/(2^{b+1}-2)}\right)\right)\right]$$

There is an additional relation between the bit size of a DMT symbol and the size of a FEC frame inherent to ADSL standards, such as G.lite, G.dmt and ANSI Standard 413:

$$Sn_{eff}b = \alpha(K+\rho S+R), \quad b = b(\gamma_{eff}) \quad (3.5)$$

where $\rho$ is the number of overhead code symbols per DMT symbol (not including FEC control code symbols.) Introducing Eq. (3.5) into Eq. (3.4) yields:

$$\chi = -\ln\frac{\beta}{\alpha} - \ln\left[\frac{\Gamma(Sn_{eff}b/\alpha)}{\Gamma(Sn_{eff}b/\alpha-0.5R)\Gamma(0.5R+1)}\right] - \quad (3.6)$$

$$(k-1)\ln\left[\frac{\Gamma(Sn_{eff}b/\alpha+1)}{\Gamma(Sn_{eff}b/\alpha-0.5R)\Gamma(0.5R+2)}\right] -$$

-continued $$(0.5R+1)k\ln\left[\frac{4\alpha(1-2^{-b/2})}{(3+2b)}\mathrm{erfc}\left(\sqrt{3\cdot 10^{\gamma/10}/(2^{b+1}-2)}\right) \times \left(2-(1-2^{b/2})\mathrm{erfc}\left(\sqrt{3\cdot 10^{\gamma/10}/(2^{b+1}-2)}\right)\right)\right]$$

In the no-ARQ case we have (k=1):

$$\chi = -\ln\frac{\beta}{\alpha} - \ln\left[\frac{\Gamma(Sn_{eff}b/\alpha)}{\Gamma(Sn_{eff}b/\alpha-0.5R)\Gamma(0.5R+1)}\right] - \quad (3.7)$$

$$(0.5R+1)\ln\left[\frac{4\alpha(1-2^{-b/2})}{(3+2b)}\mathrm{erfc}\left(\sqrt{3\cdot 10^{\gamma/10}/(2^{b+1}-2)}\right) \times \left(2-(1-2^{b/2})\mathrm{erfc}\left(\sqrt{3\cdot 10^{\gamma/10}/(2^{b+1}-2)}\right)\right)\right]$$

For $10^{\gamma/10} \gg 2^b$, typically involving a large SNR, using the asymptotic relation for $\mathrm{erfc}(\ldots)$ $$\mathrm{erfc}(x) = \frac{1}{\sqrt{\pi}}\frac{\exp(-x^2)}{x}[1+O(x^{-2})], \text{ as } x\to\infty \quad (3.8)$$

yields $$\chi = \frac{1.5(0.5R+1)k\cdot 10^{\gamma/10}}{2^b-1}\left[1+O\left(\frac{\gamma}{10^{\gamma/10}}\right)\right]$$

Eq. (3.8) shows that the BER dependence on SNR is very strong (double exponent) and that doubling the number of control code symbols is approximately equivalent in terms of BER decrease to doubling the total number of transmissions.

The BER exponent may be as well introduced as, $$\epsilon = 10^{-\chi_{10}} \quad (3.9)$$

Comparing Eq. (3.3) and (3.9) yields:

$$\chi_{10} = \chi \log e \quad (3.10)$$

4. Estimating BER Versus the Margin Applied

The method proposed can be used in estimating the actual BER in DMT or OFDM systems as a function of the margin used in SNR calculations. More specifically, the FEC scheme presently used in G.dmt and G.lite is based on the Reed-Solomon method. The data quality requirements for G.dmt and G.lite imply that the BER should not exceed the value of $10^{-7}$. To protect the channel from unexpected/non-Gaussian sources of errors, usually, an additional margin of 4 dB or more is applied to the SNR distribution over subcarriers. As our estimates presented below show, this margin value should be more than sufficient to practically eliminate the data errors in a purely AWGN channel.

Table 1 presents the dependence of $\chi_{10}$ on the margin applied. The uncoded case (the number of control bytes per an RS frame R=0, the number of sync bytes/DMT symbols per RS frame S=1) at 96 subcarriers (maximum number of working subcarriers in the G.lite downstream channel), the margin adjusted SNR=50 dB, and the size of DMT symbol $B_{dmt}$=1,286 bits, is considered. One can see that applying 4 dB of margin yields a decrease in BER up to $10^{-16}$; at 6 dB of margin a decrease in BER up to $10^{-25}$ is attained.

TABLE 1

BER vs. margin; downstream channel, FEC is not applied

| margin, dB | BER exponent |
|---|---|
| 0 | −7 |
| 1 | −8.6 |
| 2 | −10.6 |
| 3 | −13.1 |
| 4 | −16.3 |
| 5 | −20.2 |
| 6 | −25.2 |

Table 2, below, presents the dependence of $\chi_{10}$ on the margin applied. A case with FEC (R=16, S=1) at 96 sub-carriers, the margin adjusted SNR=49.8 dB, N=180 bytes, and $B_{dmt}$=1,440 bits, is considered. Here the BER value drops much sharper with each dB of margin added: for instance, applying 4 dB of margin yields a decrease in BER up to $10^{-34}$; at 6 dB a decrease in BER up to $10^{-60}$ is attained.

TABLE 2

BER vs. margin; downstream channel, FEC is applied (R = 16, S = 1).

| margin, dB | BER exponent |
|---|---|
| 0 | −7 |
| 1 | −11.9 |
| 2 | −17.9 |
| 3 | −25.3 |
| 4 | −34.5 |
| 5 | −46 |
| 6 | −60.5 |

Table 3 presents the dependence of $\chi_{10}$ on the margin applied in another case with FEC (R=16, S=2) at 96 sub-carriers, the margin adjusted SNR=37.1 dB, N=255 bytes, and $B_{bmt}$=1,018 bits. Here the BER value drops even sharper with each dB of margin added, than in the case shown in Table 2. For instance, applying 4 dB of margin yields a decrease in BER up to $10^{-37}$; at 6 dB a decrease in BER up to $10^{-66}$ is attained.

TABLE 3

BER vs. margin; downstream channel, FEC is applied (R = 16, S = 2).

| margin, dB | BER exponent |
|---|---|
| 0 | −7 |
| 1 | −12.3 |
| 2 | −19 |
| 3 | −27.3 |
| 4 | −37.6 |
| 5 | −50.5 |
| 6 | −66.6 |

Table 4 presents the dependence of $\chi_{10}$ on the margin applied in the case with FEC (R=16, S=4) at 26 subcarriers (maximum number of working subcarriers in the G.lite upstream channel), the margin adjusted SNR=49.8 dB, N=195 bytes, and $B_{dmt}$=390 bits. As for the downstream channel, in case with FEC the BER value drops much sharper with each dB of margin added than in the uncoded case. For instance, applying 4 dB of margin yields a decrease in BER up to $10^{-34}$; at 6 dB a decrease in BER up to $10^{-60}$ is attained.

TABLE 4

BER vs. margin; upstream channel, FEC is applied (R = 16, S = 1).

| margin, dB | BER exponent |
|---|---|
| 0 | −7 |
| 1 | −11.6 |
| 2 | −17.6 |
| 3 | −25 |
| 4 | −34.2 |
| 5 | −45.8 |
| 6 | −60.2 |

Table 5 presents the dependence of $\chi_{10}$ on the margin applied in another case with FEC (R=16, S=8) at 26 subcarriers (upstream channel), the margin adjusted SNR=34.7 dB, N=255 bytes, and $B_{dmt}$=255 bits. As for the downstream channel, the BER value drops more sharply with each dB of margin added, than in the case shown in Table 4. For instance, applying 4 dB of a margin yields a decrease in BER up to $10^{-37}$; at 6 dB a decrease in BER up to $10^{-66}$ is attained.

TABLE 5

BER vs. margin; upstream channel, FEC is applied (R = 16, S = 8).

| margin, dB | BER exponent |
|---|---|
| 0 | −7 |
| 1 | −12.5 |
| 2 | −19.2 |
| 3 | −27.6 |
| 4 | −38 |
| 5 | −51.1 |
| 6 | −67.4 |

Comparing Table 2 to Table 3 and Table 4 to Table 5 one can see that given the same number of RS redundancy bytes, the larger is the FEC frame size, the sharper is the BER change.

It was shown above that the margin value presently used in G.dmt and G.lite should practically eliminate bit errors due to the Gaussian noise in ADSL channels, as the level of BER in the margin-adjusted case is of the order of $10^{-7}$. In reality the data in ADSL channels occasionally get corrupted even with adding a 4 dB margin. As these non-Gaussian bursts of errors cannot always be successfully corrected by FEC methods, ARQ is a natural and convenient method to fight the burst noise. In the next section we present a method of estimating the ARQ performance gain.

5. ARQ Gain Calculation: the Channel Initially does not Support ARQ

Consider the following two states of a multicarrier channel. In both states the channel supports the same number of bits per each subcarrier at the same BER. As was shown in U.S. patent application Ser. No. 09/741,636 this means that the performance gain calculations can be performed for a hypothetical single sub-channel with the SNR averaged over all individual sub-channels of the multicarrier channel. This also means that the ARQ gain to be determined is independent of the SNR of the individual sub-channels. In the first state only FEC is applied to the channel, and the average SNR is $\gamma_1=\gamma$. In the second state both FEC and ARQ are applied to the channel, and the average SNR is $\gamma_2=\gamma-\mu_l$. Equating expressions for BER derived above, for these two states, allows one to determine the line ARQ gain $\mu_l$:

$$-\ln\frac{\beta}{\alpha} - \ln\left[\frac{\Gamma(Sn_{eff}b/\alpha)}{\Gamma(Sn_{eff}b/\alpha - 0.5R)\Gamma(0.5R+1)}\right] - \quad (5.1)$$

$$(0.5R+1)\ln\left[\frac{4\alpha(1-2^{-b/2})}{(3+2b)}\mathrm{erfc}\left(\sqrt{3 \cdot 10^{\gamma/10}/(2^{b+1}-2)}\right) \times \right. \\ \left. \left(2 - (1-2^{-b/2})\mathrm{erfc}\left(\sqrt{3 \cdot 10^{\gamma/10}/(2^{b+1}-2)}\right)\right)\right] =$$

$$-\ln\frac{\beta}{\alpha} - \ln\left[\frac{\Gamma(Sn_{eff}b/\alpha)}{\Gamma(Sn_{eff}b/\alpha - 0.5R)\Gamma(0.5R+1)}\right] -$$

$$(k-1)\ln\left[\frac{\Gamma(Sn_{eff}b/\alpha + 1)}{\Gamma(Sn_{eff}b/\alpha - 0.5R)\Gamma(0.5R+2)}\right] -$$

$$(0.5R+1)k\ln\left[\frac{4\alpha(1-2^{-b/2})}{(3+2b)}\mathrm{erfc}\left(\sqrt{3 \cdot 10^{(\gamma-\mu_l)/10}/(2^{b+1}-2)}\right) \times \right. \\ \left. \left(2 - (1-2^{-b/2})\mathrm{erfc}\left(\sqrt{3 \cdot 10^{(\gamma-\mu_l)/10}/(2^{b+1}-2)}\right)\right)\right]$$

Equation (5.1) yields the following expression for the maximum number of transmissions vs. $\mu_l$ $$k = \quad (5.2)$$

$$\frac{\left\{\ln\left[\frac{\Gamma(Sn_{eff}b/\alpha+1)}{\Gamma(Sn_{eff}b/\alpha - 0.5R)\Gamma(0.5R+2)}\right] + \right.}{\left. (0.5R+1)\ln\left[\frac{4\alpha(1-2^{-b/2})}{(3+2b)}\mathrm{erfc}\left(\sqrt{3 \cdot 10^{\gamma/10}/(2^{b+1}-2)}\right) \times \left(2-(1-2^{-b/2})\mathrm{erfc}\left(\sqrt{3 \cdot 10^{\gamma/10}/(2^{b+1}-2)}\right)\right)\right]\right\}}{\left\{\ln\left[\frac{\Gamma(Sn_{eff}b/\alpha+1)}{\Gamma(Sn_{eff}b/\alpha - 0.5R)\Gamma(0.5R+2)}\right] + \right.\\ \left.(0.5R+1)\ln\left[\frac{4\alpha(1-2^{-b/2})}{(3+2b)}\mathrm{erfc}\left(\sqrt{3 \cdot 10^{(\gamma-\mu_l)/10}/(2^{b+1}-2)}\right) \times \left(2-(1-2^{-b/2})\mathrm{erfc}\left(\sqrt{3 \cdot 10^{(\gamma-\mu_l)/10}/(2^{b+1}-2)}\right)\right)\right]\right\}}$$

or $$k = \frac{1 + \Theta(R, S, n_{eff}, b, \gamma)}{1 + \Theta(R, S, n_{eff}, b, \gamma - \mu_l)} \quad (5.3)$$

where $$\Theta(R, S, n_{eff}, b, \gamma) = \quad (5.4)$$

$$\frac{(0.5R+1)\ln\left[\frac{4\alpha(1-2^{-b/2})}{(3+2b)}\mathrm{erfc}\left(\sqrt{3 \cdot 10^{\gamma/10}/(2^{b+1}-2)}\right) \times \left(2-(1-2^{-b/2})\mathrm{erfc}\left(\sqrt{3 \cdot 10^{\gamma/10}/(2^{b+1}-2)}\right)\right)\right]}{\ln\left[\frac{\Gamma(Sn_{eff}b/\alpha+1)}{\Gamma(Sn_{eff}b/\alpha - 0.5R)\Gamma(0.5R+2)}\right]}$$

Everywhere below the notation $\Theta(\gamma)$ means $\Theta(R, S, n_{eff}, b, \gamma)$. For given $b$ and FEC parameters, at large $\gamma$, such as when $10^{\gamma/10} \gg 2^b$, one can simplify Eq. (5.3):

$$k \approx \frac{\Theta(\gamma)}{\Theta(\gamma - \mu_l)} \quad (5.5)$$

-continued $$\frac{\ln\left[\frac{4\alpha(1-2^{-b/2})}{(3+2b)}\mathrm{erfc}\left(\sqrt{3 \cdot 10^{\gamma/10}/(2^{b+1}-2)}\right) \times \left(2-(1-2^{-b/2})\mathrm{erfc}\left(\sqrt{3 \cdot 10^{\gamma/10}/(2^{b+1}-2)}\right)\right)\right]}{\ln\left[\frac{4\alpha(1-2^{-b/2})}{(3+2b)}\mathrm{erfc}\left(\sqrt{3 \cdot 10^{(\gamma-\mu_l)/10}/(2^{b+1}-2)}\right) \times \left(2-(1-2^{-b/2})\mathrm{erfc}\left(\sqrt{3 \cdot 10^{(\gamma-\mu_l)/10}/(2^{b+1}-2)}\right)\right)\right]}$$

$$\approx \frac{10^{\gamma/10}}{10^{(\gamma-\mu_l)/10}}$$

$$= 10^{\mu_l/10}$$

or, asymptotically, $$\mu_l = 10 \log k \quad (5.6)$$

The difference between the $\gamma$ values in cases with and without ARQ is related to the number of transmissions by a simple formula. Particularly, at $k=2$ one can gain 3 dB if ARQ is applied. Eq. (5.6) also shows that at large SNR in order to double the line ARQ gain one has to increase the maximum allowed number of transmissions from $k$ to $k^2$.

Equations presented in this section describe the line ARQ gain that is discounted neither for the control symbols transmitted with each codeword nor for the throughput loss due to re-transmissions. The net gain relevant to the change in throughput due to these factors is:

$$\mu_n = \mu_l - 10 \log \nu \quad (5.7)$$

where $\nu$ is the average number of transmissions in channel with ARQ derived in the referenced prior applications for small BER:

$$\nu = \left(1 - \frac{K+\rho S + R}{0.5 \cdot R + 1}\varepsilon_s\right) \bigg/ \left[1 - \left(\frac{K+\rho S + R}{0.5 \cdot R + 1}\varepsilon_s\right)^{1/k}\right] \quad (5.8)$$

$$= \left(1 - \frac{Sn_{eff}b}{0.5 \cdot R + 1}\frac{\varepsilon}{\beta}\right) \bigg/ \left[1 - \left(\frac{Sn_{eff}b}{0.5 \cdot R + 1}\frac{\varepsilon}{\beta}\right)^{1/k}\right]$$

and $\epsilon$ in Eq. (5.8) is defined by Eqs. (3.3) and (3.7) at $\gamma = \gamma_1$ (according to Eq. (5.3) $\epsilon$ is the same in both states $\gamma = \gamma_1$ and $\gamma = \gamma_2$).

We will show below that, unlike the line ARQ gain growing monotonically with increasing k, the net ARQ gain attains a maximum at certain $k_{opt}$ (the optimum allowable number of transmissions) and then goes down.

6. ARQ Gain Calculation: the Channel Initially Supports ARQ

Consider now the following two states of a multicarrier channel. In both states the channel supports the same number of bits per each subcarrier at the same BER. In the first state, both FEC and $k_1$-ARQ are applied to the channel, and the average SNR is $\gamma_1 = \gamma$. In the second state, both FEC and $k_2$-ARQ are applied to the channel and the average SNR is $\gamma_2 = \gamma - \mu_l$. Equating expressions for BER derived above, for these two states, allows one to determine the line ARQ gain $\mu_l$ from the following equation:

$$\frac{k_2}{k_1} = \frac{1 + \Theta(\gamma)}{1 + \Theta(\gamma - \mu_l)} \quad (6.1)$$

where the function appearing in the numerator and denominator on the right hand side of Eq. (6.1) is defined by Eq. (5.4). Eq. (6.1) shows that if there is a sequence of channel states characterized by different k the ARQ gain realized in this sequence depends only on its first and last state, i.e.:

$$\frac{k_{i^*+1}}{k_1} = \prod_{i=1}^{i^*} \frac{k_{i+1}}{k_i} = \prod_{i=1}^{i^*} \frac{1 + \Theta(\gamma_i)}{1 + \Theta(\gamma_{i+1})} = \frac{1 + \Theta(\gamma_0)}{1 + \Theta(\gamma_{i^*+1})} \quad (6.2)$$

For given b and FEC parameters, at large γ one can simplify Eq. (6.1), which yields:

$$\mu_l = 10 \log\left(\frac{k_2}{k_1}\right) \quad (6.3)$$

Eq. (6.3) shows that the larger was the initially allowed maximum number of transmissions the less significant would be the line ARQ gain realized by increasing k.

Finally, Eq. (5.7) for the net ARQ gain takes the form:

$$\mu_n = \mu_l + 10 \log(v_1/v_2) \quad (6.4)$$

and ε in Eq. (5.8) for $v_1$ and $v_2$ is defined by Eqs. (3.3) and (3.6) at $\gamma=\gamma_1$ or $\gamma=\gamma_2$. According to Eq. (6.1) ε is the same in both states $\gamma=\gamma_1$ and $\gamma=\gamma_2$. Below Eq. (6.4) is derived.

Let us introduce SNR per b information bits received (as if a QAM symbol would consist of information bits only), $$10^{\gamma_{i^*}/10} = \frac{N_i v_i}{K_i} 10^{\gamma_i/10}, i = 1, 2 \quad (6.5)$$

where $N_i$ and $K_i$ are the total FEC frame length and the length of the information part. This yields:

$$\mu_n = \gamma_{1^*} - \gamma_{2^*} = 10\log\left(\frac{N_1 v_1}{K_1} 10^{\gamma_1/10} / \frac{N_2 v_2}{K_2} 10^{\gamma_2/10}\right) \quad (6.6)$$

$$= \gamma_1 - \gamma_2 + 10\log\left(\frac{N_1 K_2 v_1}{N_2 K_1 v_2}\right)$$

Since in our case the FEC parameters are the same in both states, using the line gain definition $$\gamma_1 - \gamma_2 = \mu_l, \quad (6.7)$$

yields Eq. (6.4). In particular case of $k_1=1$ we obtain Eq. (5.7).

As the net ARQ gain represents the decrease in energy needed to successfully transmit b information bits, and $\mu_n/10$ log 2 is an estimate for the additional (to b bits) number of information bits one can transmit at the same BER. Here, the factor 10 log 2 is a typical scaling factor between representations of gain in dB and bits, for QAM systems. Accordingly, $$\frac{\mu_n}{10b\log 2} \quad (6.8)$$

is the relative channel throughput increase due to ARQ.

7. Algorithm of Evaluating the ARQ Gain

Based on the derivations presented above, the following method of approximating the ARQ gain is proposed.

Let the data in an xDSL channel be transmitted with the parameters b, $n_{eff}$, R, S, $k_1$, $\gamma_{eff}$. To protect the channel from burst errors the service provider might want to increase the ARQ level to $k_2 > k_1$. At the same time the provider has to know whether this action would yield a better performance of the channel, i.e. whether increasing the maximum number of transmissions would yield a positive net ARQ gain (that can be used to load and transmit additional bits). To find this out one has to subsequently estimate k(i) from Eq. (6.1) and $\mu_l(i)$ from Eq. (6.4), given k(i-1) and $\mu_l(i-1)=(i-1)*\Delta\mu_l$, where $\Delta\mu_l$ is the required precision of determining the ARQ gain (0.5 dB for G.lite/G.dmt standards). The initial conditions are $k(1)=k_1$ and $\mu_l(1)=\mu_n(1)=0$. After each step it is checked whether $\mu_n(i) > \mu_n(i-1)$, otherwise the calculations are stopped, as it is seen that the $\mu_n$ maximum has been reached and, therefore, raising the ARQ level to $k=k_2$ is not beneficial performance-wise. If calculations began with an excessive number of transmissions, the search could proceed in the opposite direction. Generally, one looks for a point of maxima.

For a certain i, one has $k(i-1) \leq k_2 \leq k(i)$. Then the line ARQ gain value corresponding to $k=k_2$ can be approximately found from the following equality:

$$\frac{\mu_l - \mu_l(i)}{k - k(i)} = \frac{\mu_l - \mu_l(i-1)}{k - k(i-1)} \quad (7.1)$$

which yields $$\mu_l = \left[\frac{\mu_l(i)}{k - k(i)} - \frac{\mu_l(i-1)}{k - k(i-1)}\right] / \left[\frac{1}{k - k(i)} - \frac{1}{k - k(i-1)}\right] \quad (7.2)$$

The line ARQ gain determined by Eq. (7.2) can be used for loading more bits at each sub-channel of the multicarrier channel, according to the formula:

$$\Delta b = \mu_l / 10 \log 2 \quad (7.3)$$

The procedure described above may be performed during the transceiver initialization. Tables 6 and 7 illustrate this procedure. The calculations to generate these tables were performed in MatLab.

Table 6 presents the results of computing the number of transmissions and the net ARQ gain corresponding to a set of the line ARQ gain values obtained incrementally with a step of 0.5 dB. The channel is characterized by $b_{eff}=3$ bits, $n_{eff}=96$, R=2, S=1, $k_1=1$, and $\gamma_{eff}=20.5$ dB. The BER value, for this channel, is $4.6 \cdot 10^{-21}$. One way to find the line ARQ gain corresponding to k=2 involves five steps of increasing the line dB gain in 0.5 dB increments to $\mu_l=2.5$ dB. However, the net ARQ gain increases with increasing k up to 14 transmissions; it starts decreasing at k>14. Therefore, if the modem memory allows for that, the optimum total number of transmissions should be set to 14, and the line ARQ gain to 6.5 dB.

TABLE 6

| $\mu_L$, dB | k | $\mu_n$, dB |
|---|---|---|
| 0.5 | 1.14 | 0.5 |
| 1 | 1.31 | 1 |
| 1.5 | 1.5 | 1.5 |
| 2 | 1.73 | 2 |
| 2.5 | 2.01 | 2.5 |
| 3 | 2.35 | 3 |
| 3.5 | 2.75 | 3.5 |
| 4 | 3.27 | 4 |
| 4.5 | 3.92 | 4.5 |
| 5 | 4.77 | 5 |
| 5.5 | 5.93 | 5.5 |
| 6 | 7.58 | 5.98 |
| 6.5 | 10.1 | 6.44 |
| 7 | 14.4 | 6.77 |
| 7.5 | 23.3 | 6.75 |

Table 7 presents the results of computing the number of transmissions and the net ARQ gain corresponding to a set of the line ARQ gain values obtained incrementally with a step of 0.5 dB. The channel is characterized by $b_{eff}=15$ bits, $n_{eff}=96$, R=16, S=1, $k_1=1$, and $\gamma_{eff}=54$ dB. The BER value for this channel is 2.4 $10^{-37}$. The net ARQ gain increases with increasing k up to 8 transmissions; it starts decreasing at k>8. Therefore, if the modem memory allows for that, the optimum total number of transmissions should be set to 8, and the line ARQ gain to 5 dB.

TABLE 7

| $\mu_L$, dB | k | $\mu_n$, dB |
|---|---|---|
| 0.5 | 1.17 | 0.5 |
| 1 | 1.38 | 1 |
| 1.5 | 1.65 | 1.5 |
| 2 | 2.00 | 2 |
| 2.5 | 2.46 | 2.5 |
| 3 | 3.1 | 3 |
| 3.5 | 4.5 | 3.5 |
| 4 | 5.59 | 4 |
| 4.5 | 8.5 | 4.997 |
| 5 | 15.93 | 4.97 |
| 5.5 | 7.46 | 3.69 |

8. A Fast Method of Determining the Optimum ARQ Parameters at an Arbitrary Margin Value.

Table 8 presents the results of computing the number of transmissions and the net ARQ gain corresponding to a set of line ARQ gain values calculated incrementally with a step of 0.5 dB. The channel is characterized by $b_{eff}=3$ bits, $n_{eff}=96$, R=2, S=1, $k_1=1$, and $\gamma_{eff}=16$ dB. The BER value, for this channel, is 3.6 $10^{-7}$. In this example, to find the line ARQ gain corresponding to k=2 involved four steps of incrementally increasing the line gain. The net ARQ gain increases with increasing k up to 3 transmissions; it starts decreasing at k>3. Here the optimum total number of transmissions should be set to 3, and the corresponding line ARQ gain will be ~2 dB.

Note that in this case the channel parameters are the same as that in the calculation shown in Table 6, except for the value of SNR. Here the ARQ parameters are estimated at the SNR of 20.5 dB, adjusted to the margin 4.5 dB. This yields the margin-adjusted SNR of 20.5−4.5=16 dB, for which one has the BER~$10^{-7}$ (G.lite/G.dmt requirement). In the case shown in Table 6, a zero margin is applied and the BER value is lower (~$10^{-21}$). Our calculations show that the difference in margin values in both cases (4.5 dB) is approximately equal to the difference in the optimum values of line ARQ gain. Thus, applying a larger optimum line ARQ gain (loading more bits over subchannels) against the system margin can compensate the throughput loss caused by requiring a larger margin value.

TABLE 8

| $\mu_L$, dB | k | $\mu_n$, dB |
|---|---|---|
| 0.5 | 1.21 | 0.495 |
| 1 | 1.51 | 0.997 |
| 1.5 | 1.93 | 1.485 |
| 2 | 2.58 | 1.938 |
| 2.5 | 3.67 | 2.274 |
| 3 | 5.95 | 2.251 |

Table 9 presents the results of computing the number of transmissions and the net ARQ gain corresponding to a set of line ARQ gain values calculated incrementally with a step of 0.5 dB. The channel is characterized by $b_{eff}=15$ bits, $n_{eff}=96$, R=16, S=1, $k_1=1$, and $\gamma_{eff}=49.8$ dB. The BER value, for this channel, is 0.8 $10^{-7}$. In this example to find the line ARQ gain corresponding to k=2 involved one step. The net ARQ gain increases with increasing k up to 2 transmissions; it starts decreasing at k>2. Here the optimum total number of transmissions should be set to 2, and the corresponding line ARQ gain will be ~0.5 dB.

Note that in this case the channel parameters are the same as those in the calculation shown in Table 7, except for the value of SNR. Here the ARQ parameters are estimated at the SNR of 54 dB, adjusted to the margin 4.2 dB. This yields the margin-adjusted SNR of 54−4.2=49.8 dB, for which one has the BER~$10^{-7}$ (G.lite/G.dmt requirement). In the case shown in Table 7 a zero margin is applied and the BER value is lower (~$10^{-37}$). Again, our calculations show that the difference in SNR values in both cases (4 to 4.5 dB) is approximately equal to the difference in the optimum values of line ARQ gain. Again, applying a larger optimum line ARQ gain against the system margin can exactly compensate the throughput loss caused by requiring a larger margin value.

TABLE 9

| $\mu_L$, dB | k | $\mu_n$, dB |
|---|---|---|
| 0.25 | 1.24 | 0.498 |
| 0.5 | 1.61 | 0.853 |
| 0.75 | 2.26 | −1.656 |

This surprising independence of the difference between the average channel SNR and the optimum (throughput-wise) line ARQ gain on the average channel SNR observed in our calculations and described above is not accidental. It results from the mathematical structure of the model. In the next section this independence will be demonstrated. Then, using this result, we will formulate a simple and fast method of determining the optimum ARQ parameters at the actual channel conditions, based on their values at some reference conditions, the latter being either stored in the modem memory or pre-calculated prior to channel initialization.

Consider again the following two states of a multicarrier channel. In both states, the channel supports the same number of bits per each subcarrier at the same BER. In the first state, both FEC and $k_1$-ARQ are applied to the channel, and the average SNR is $\gamma_1=\gamma$. In the second state, both FEC and $k_2$-ARQ are applied to the channel, and the average SNR is $\gamma_2 = \gamma - \mu_l$. The line ARQ gain of replacing system 1 by system 2 is then $\mu_l = \gamma_1 - \gamma_2$. Let us look at the dependence of the net ARQ gain $\mu_n$ on the line ARQ gain $\mu_l$, and let this dependence have a maximum at $\mu_{l,opt}$, the corresponding value of $k_2$ is $k_{2,opt}$. Below we will prove that $\gamma - \mu_{l,opt}$ is an invariant, i.e. it does not depend on $\gamma$, for given parameters b, $n_{\mathit{eff}}$, R, and S. To show this, consider again the expression of the net ARQ gain:

$$\mu_n = \mu_l + 10 \log(v_1/v_2) \tag{8.1}$$

where $$v_1 = \left(1 - \frac{K + \rho S + R}{0.5 \cdot R + 1}\frac{\alpha}{\beta}\varepsilon\right) \Big/ \left[1 - \left(\frac{K + \rho S + R}{0.5 \cdot R + 1}\frac{\alpha}{\beta}\varepsilon\right)^{1/k_1}\right] \tag{8.2}$$

$$v_2 = \left(1 - \frac{K + \rho S + R}{0.5 \cdot R + 1}\frac{\alpha}{\beta}\varepsilon\right) \Big/ \left[1 - \left(\frac{K + \rho S + R}{0.5 \cdot R + 1}\frac{\alpha}{\beta}\varepsilon\right)^{1/k_2}\right] \tag{8.3}$$

and $$k_2 = \frac{1 + \Theta(\gamma)}{1 + \Theta(\gamma - \mu_l)} k_1 \tag{8.4}$$

To prove the $\gamma - \mu_{l,opt}$ invariance, using Eqs. (8.1)–(8.3), let us introduce an auxiliary function $\Omega(\gamma, \mu_l)$, as follows:

$$\Omega(\gamma, \mu_l) \equiv \frac{10^{(\mu_n - \gamma)/10}\left(1 - \frac{K + \rho S + R}{0.5 \cdot R + 1}\frac{\alpha}{\beta}\varepsilon\right)}{v_1} \tag{8.5}$$
$$= 10^{(\mu_l - \gamma)/10}\left[1 - \left(\frac{K + \rho S + R}{0.5 \cdot R + 1}\frac{\alpha}{\beta}\varepsilon\right)^{1/k_2}\right]$$

In terms of determining $\mu_{l,opt}$, maximizing the net ARQ gain is equivalent to maximizing the function $\Omega(\gamma, \mu_l)$ in Eq. (8.5) because $$\frac{\partial \mu_n}{\partial \mu_l} = 0 \Leftrightarrow \frac{\partial \Omega(\gamma, \mu_l)}{\partial \mu_l} \equiv \frac{\partial \Omega(\gamma, \mu_l)}{\partial \mu_n}\frac{\partial \mu_n}{\partial \mu_l} = 0 \tag{8.6}$$

and because $\varepsilon$ in Eq. (8.5) is the same for all $(\mu_l, k_2(\mu_l))$ states. Now let us show that although $k_2$ is a function of both $\gamma$ and $\mu_l$, the expression is the denominator of $\Omega(\gamma, \mu_l)$ depends on the difference $\gamma - \mu_l$ rather than on $\gamma$ and $\mu_l$ separately. To do that let us, using Eq. (2.3), rewrite Eq. (3.2) in the following form, for the second state:

$$\left(\frac{K + \rho S + R}{0.5 \cdot R + 1}\frac{\alpha}{\beta}\varepsilon\right)^{1/k_2} = \tag{8.7}$$

$$\left[\frac{4\alpha(1 - 2^{-b/2})}{(3 + 2b)}\left[\left(\frac{K + \rho S + R}{0.5R + 1}\right)\right]^{\frac{1}{(0.5R+1)}}\mathrm{erfc}\left(\sqrt{3 \cdot 10^{(\gamma - \mu_l)/10}/(2^{b+1} - 2)}\right) \times \right.$$
$$\left. \left(2 - (1 - 2^{-b/2})\mathrm{erfc}\left(\sqrt{3 \cdot 10^{(\gamma - \mu_l)/10}/(2^{b+1} - 2)}\right)\right)\right]^{(0.5R+1)}$$

or $$\frac{1}{k_2}\ln\left(\frac{K + \rho S + R}{0.5 \cdot R + 1}\frac{\alpha}{\beta}\varepsilon\right) = \tag{8.8}$$
$$(1 + \Theta(\gamma - \mu_l))\ln\left[\frac{\Gamma(Sn_{\mathit{eff}}b/\alpha + 1)}{\Gamma(Sn_{\mathit{eff}}b/\alpha - 0.5R)\Gamma(0.5R + 2)}\right]$$

Using Eq. (8.8), Eq. (8.5) can be rewritten as follows:

$$\Omega(\gamma, \mu_l) = 10^{(\mu_l - \gamma)/10} \tag{8.9}$$
$$\left\{1 - \exp\left[(1 + \Theta(\gamma - \mu_l))\ln\left(\frac{\Gamma(Sn_{\mathit{eff}}b/\alpha + 1)}{\Gamma(Sn_{\mathit{eff}}b/\alpha - 0.5R)\Gamma(0.5R + 2)}\right)\right]\right\}$$

But Eq. (8.9) depends on $\gamma - \mu_l$ rather than on $\gamma$ and $\mu_l$. Therefore, in accordance to Eq. (8.6), $\gamma - \mu_{l,opt}$ is invariant with respect to $\gamma$ which is what we set out to prove.

The result proven above allows us to propose the following fast method of determining the optimum ARQ parameters at the actual channel conditions (e.g. for zero margin), based on their values at some reference conditions yielding a certain standard-stipulated BER (e.g. for actual margin).

Let the reference ARQ parameters correspond to a certain standard-stipulated BER ($10^{-7}$ for G.lite and G.dmt). Let these reference conditions correspond to SNR equal to $\gamma_1$. The reference optimum ARQ parameters $\mu_{l,opt,1}$ and $k_{1,opt}$ should be either stored in the modem memory or pre-calculated prior to channel initialization. The channel is characterized by the following actual parameters: $\gamma_2$, $\mu_{l,opt,2}$ and $k_{2,opt}$. The margin value of $M = \gamma_2 - \gamma_1$ is used in the bit loading process; i.e. M is the difference between the actual and margin-adjusted SNR values.

After $\mu_{l,opt,1}$ is obtained one way or another, the $\mu_{l,opt,2}$ value is to be found from the following equation:

$$\gamma_2 - \mu_{l,opt,2} = \gamma_1 - \mu_{l,opt,1} \tag{8.10}$$

The new optimum k is then obtained as follows:

$$k_{2,opt} = \frac{1 + \Theta(\gamma_2)}{1 + \Theta(\gamma_2 - \mu_{l,opt,2})} \tag{8.11}$$

Note that Eq. (8.11) is nothing but Eq. (5.3) written for actual channel conditions. Writing Eq. (5.3) for reference conditions yields:

$$k_{1,opt} = \frac{1 + \Theta(\gamma_1)}{1 + \Theta(\gamma_1 - \mu_{l,opt,1})} \quad (8.12)$$

Finally, combining Eqs. (8.10) to (8.12) yields:

$$\frac{k_{2,opt}}{k_{1,opt}} = \frac{1 + \Theta(\gamma_2)}{1 + \Theta(\gamma_1)} \quad (8.13)$$

If the reference optimum ARQ parameters need to be pre-calculated during the communication session prior to channel initialization, one can determine the optimum line ARQ gain for that margin (and at the standard-stipulated BER) using the procedure described in Section 6. As the results presented in Tables 8 and 9 show, the consequent search for the maximum of the net ARQ gain at the standard-stipulated BER=$10^{-7}$ takes just a few incremental (0.5 dB) steps using Eq. (6.1), compared to the cases with zero margin (Tables 6 and 7). Then Eqs. (8.10) and (8.11) or (8.13) may be applied for finding the actual optimum ARQ parameters. As this method requires less computation of special functions contained in Eq. (6.1), it works much faster than plainly incrementing, at zero margin, the line ARQ gain by $\Delta\mu_l$ until the maximum of the net ARQ gain is reached.

9. General FEC and ARQ Optimization of the Channel Performance

The methods presented above imply that the FEC parameters stay unchanged and that the channel performance is optimized for the total number of transmissions only. As calculations performed in the referenced prior applications show, this assumption may yield a sub-optimal set of FEC and ARQ parameters. Tables 10 and 11, below, show the optimum error control parameters computed for a hypothetical G.lite-compliant modem transceiver with and without ARQ, respectively. One can see that often the optimal (S,R) sets are different, for the same values of an effective SNR and an effective number of sub-channels, in channels with and without ARQ. In cases with ARQ the optimal value of R is typically smaller, as here some part of the FEC redundancy may be omitted.

The generalized method of optimizing channel performance with respect to both FEC and ARQ parameters comprises: For each allowable set of FEC parameters, compute (or extract from pre-calculated tables) the corresponding net performance gain without ARQ; For each allowable set of FEC parameters, compute the corresponding net ARQ gain at the total number of transmissions value of k; Compare all "net FEC gain+net ARQ gain" values, for all sets of FEC parameters, and find the maximum.

As the total number of possible FEC parameter sets may be quite large (23 in case of G.dmt-compliant modems), there is always a small group of closely competing (performance-wise) (S,R) sets (often two or three). For instance, at the effective SNR of 40 dB and the effective number of sub-channels of 71, the set of (2,8) competes against (2,4) and (1,4), as can be seen from Tables 10 and 11. Therefore, another effective method of optimizing FEC and ARQ parameters comprises: For all allowable sets of FEC parameters, determine from computations (or extract from pre-calculated tables) a plurality of sets (e.g., two or three) yielding the largest net performance gain without ARQ; For each selected set of FEC parameters, compute (or extract from pre-calculated tables) the corresponding net performance gain without ARQ; For each selected set of FEC parameters, compute the corresponding net ARQ gain at the total number of transmissions value of k; Compare all "net FEC gain+net ARQ gain" values, for all selected sets of FEC parameters, and find the maximum.

TABLE 10

| $n_{eff}/\gamma_{eff}$ | 10 | 20 | 30 | 40 | 50 |
|---|---|---|---|---|---|
| 1 | 1/0/1 | 1/0/1 | 1/0/7 | 1/0/5 | 1/0/4 |
| 6 | 1/0/8 | 1/0/5 | 1/0/4 | 1/0/3 | 1/0/3 |
| 11 | 1/0/7 | 1/0/4 | 1/0/4 | 1/0/3 | 1/0/3 |
| 16 | 1/0/6 | 1/0/4 | 8/8/2 | 8/8/2 | 8/8/2 |
| 21 | 1/0/6 | 16/16/2 | 8/8/2 | 8/8/2 | 4/4/2 |
| 26 | 1/0/6 | 8/8/3 | 8/8/2 | 4/4/2 | 4/4/2 |
| 31 | 16/16/3 | 8/8/3 | 8/8/2 | 4/8/2 | 4/8/2 |
| 36 | 16/16/3 | 8/16/2 | 4/8/2 | 4/8/2 | 2/4/2 |
| 41 | 16/16/3 | 8/16/2 | 4/8/2 | 4/8/2 | 2/4/2 |
| 46 | 16/16/3 | 8/16/2 | 4/8/2 | 2/4/2 | 2/4/2 |
| 51 | 8/16/3 | 4/8/3 | 4/8/2 | 2/4/2 | 2/4/2 |
| 56 | 8/16/3 | 4/8/3 | 4/8/2 | 2/4/2 | 2/4/2 |
| 61 | 8/16/3 | 4/8/3 | 4/8/2 | 2/8/2 | 2/8/2 |
| 66 | 8/16/3 | 4/16/2 | 2/8/2 | 2/8/2 | 2/8/2 |
| 71 | 8/16/3 | 4/16/2 | 2/8/2 | 2/8/2 | 1/4/2 |
| 76 | 8/16/3 | 4/16/2 | 2/8/2 | 2/8/2 | 1/4/2 |
| 81 | 8/16/3 | 4/16/2 | 2/8/2 | 2/8/2 | 1/4/2 |
| 86 | 8/16/3 | 4/16/2 | 2/8/2 | 2/8/2 | 1/4/2 |
| 91 | 8/16/3 | 4/16/2 | 2/8/2 | 1/4/2 | 1/4/2 |
| 96 | 8/16/3 | 4/16/2 | 2/8/2 | 1/4/2 | 1/4/2 |

This table depicts optimum FEC/ARQ parameters (S/R/k) calculated for a hypothetical G.lite modem at different $n_{eff}$ and $\gamma_{eff}$ values (number of effective bins runs from 1 to 96, an effective SNR runs from 10 to 50, number of transmissions varied between 1 and 10).

TABLE 11

| $n_{eff}/\gamma_{eff}$ | 10 | 20 | 30 | 40 | 50 |
|---|---|---|---|---|---|
| 1 | 1/0 | 1/0 | 1/0 | 1/0 | 1/0 |
| 6 | 1/0 | 16/16 | 16/16 | 16/16 | 16/16 |
| 11 | 16/16 | 16/16 | 16/16 | 16/16 | 8/8 |
| 16 | 16/16 | 16/16 | 8/8 | 8/8 | 8/8 |
| 21 | 16/16 | 16/16 | 8/8 | 8/8 | 4/4 |
| 26 | 16/16 | 16/16 | 8/16 | 4/8 | 4/8 |
| 31 | 16/16 | 8/16 | 8/16 | 4/8 | 4/8 |
| 36 | 16/16 | 8/16 | 4/8 | 4/8 | 2/4 |
| 41 | 16/16 | 8/16 | 4/8 | 4/8 | 2/4 |
| 46 | 16/16 | 8/16 | 4/16 | 4/1 | 2/8 |
| 51 | 16/16 | 8/16 | 4/16 | 2/8 | 2/8 |
| 56 | 16/16 | 4/16 | 4/16 | 2/8 | 2/8 |
| 61 | 16/16 | 4/16 | 4/16 | 2/8 | 2/8 |
| 66 | 16/16 | 4/16 | 2/8 | 2/8 | 2/8 |
| 71 | 8/16 | 4/16 | 2/8 | 2/8 | 2/4 |
| 76 | 8/16 | 4/16 | 2/8 | 2/8 | 1/4 |
| 81 | 8/16 | 4/16 | 2/8 | 2/8 | 1/4 |
| 86 | 8/16 | 4/16 | 2/8 | 2/8 | 1/4 |
| 91 | 8/16 | 4/16 | 2/8 | 2/8 | 1/8 |
| 96 | 8/16 | 4/16 | 2/16 | 1/8 | 1/8 |

This table depicts optimum FEC parameters (S/R) calculated for G.lite modem at different $n_{eff}$ and $\gamma_{eff}$ values (number of effective bins runs from 1 to 96, effective SNR runs from 10 to 50).

10. Summary

We have demonstrated a number of general results of practical application herein. For a multicarrier communication channel, we formulated a quantitative method of estimating BER as a function of the signal-to-noise ratio (SNR) applied in the presence of FEC and ARQ. We formulated a method of trading off the level of margin applied to a multicarrier channel and the number of transmissions allowed. We derive an explicit relationship between increasing the k value and a margin decrease (or the line ARQ gain) it allows to achieve. A systematic procedure of adjusting the bit load, throughput, and k values in re-initializing multi-carrier channels is proposed. We proved that for given bit load and FEC parameters, the difference between the channel SNR and the line ARQ gain corresponding to the maximum channel throughput is independent of the channel SNR value. Using this result, we formulate a simple and efficient method of determining the optimum ARQ parameters at the actual channel conditions, based on their values at some reference conditions, the latter being either stored in the modem memory or pre-calculated prior to channel initialization. Methods proposed are quite general and are therefore applicable both to the wired (G.992.2- and G.992.1-compliant) and wireless (802.11a- or 802.16-compliant) channels.

11. Applications

FIG. 1 depicts one application of the present invention. Two devices 101, 111 are in communication via a communication channel 120. This communication channel is a multicarrier channel including multiple sub bands. The communication channel may be wired or wireless. The communication channel may be symmetrical or asymmetrical. The data transmitted over the communication channel may be protected by a combination of forward error correction and automatic repeat request protocols (FEC/ARQ). When communication is first established between the two devices, FEC/ARQ parameters are selected. During an initialization period, parameters may be selected or default parameters may be modified. During subsequent operation, line conditions may change. For instance, changes in temperatures of copper wires used to connect two devices may have an effect of 3 to 12 dB on the signal-to-noise ratio of the communication channel. The two devices may adopt different communication parameters, either periodically or based on experience operating with the particular set of parameters.

In one embodiment, devices 101, 111 may include a processor capable of carrying out calculations to determine appropriate parameters. In another embodiment, the devices include lookup tables 102, 112 in which the results of pre-computed calculations are stored. These results may be values or simply preferences or rank orderings of one or more sets of parameters. As relatively complex computations are useful to determine the appropriate parameters, pre-computation places less computing requirements on the devices than real-time computation.

An application of the present invention is calculation of bit error rates applicable to a multicarrier communication channel. Calculated bit error rates may be applied to testing lines, evaluating performance of lines, or evaluating parameters selected for protection of a communication channel. Calculated bit error rates also contribute to selection of communication parameters to apply or applicable to the communication channel. Analytical approximation of a bit error rate is an alternative to experimentally testing a variety of FEC/ARQ parameters to determine actual bit error rates. Analytical approximation includes use of numerical methods, to solve complex equations. Analytical approximation is based on at least signal-to-noise ratio, an average bit loading of the effective subcarriers and the FEC/ARQ parameters selected. The number of effective subcarriers used also may be significant. Calculation of the bit error rate may be based on equations 3.3 and 3.4, on equations 3.5 and 3.6 or on equation 3.8. In equation 3.8, the "O" term of the equation tends toward zero for a signal-to-noise ratio above 20. As this term tends toward zero, it may be ignored or given a small, approximate value. The approximation may be pre-computed, based on the signal-to-noise ratio.

It may be useful to apply the present invention to pre-compute results of applying alternative FEC/ARQ communication parameters. Results may be pre-computed for either a single signal-to-noise ratio or range of signal-to-noise ratios applicable to effective subcarriers of the channel. Given a signal-to-noise ratio, alternative communication parameters may describe an average bit loading of the subcarriers and the FEC/ARQ parameters. The effective number of subcarriers also may be described. From some of these parameters, the effective bit error range may be analytically approximated, typically using numerical methods. The approximation may be recorded on machine readable memory, such as RAM or non-volatile memory. The equations used in real-time may alternatively be used to pre-compute results.

The present invention also may be applied to approximate a signal-to-noise ratio gain resulting from application of an automatically repeat request protocol with a particular number of transmissions allowed to a forward error correction encoded multicarrier communication channel. The initial value for number of transmissions allowed may be one or greater. The formulas applied may depend on the initial value for number of transmissions allowed. The signal-to-noise ratio gain may be approximated beginning with measuring an initial signal-to-noise ratio and then analytically approximating a signal-to-noise ratio gain using at least the initial signal-to-noise ratio, an average bit loading of the effective subcarriers, in the FEC/ARQ parameters. One ARQ parameter may be the number of transmissions allowed (k).

Lookup tables may be generated from approximation of signal-to-noise ratio gains, for one or more signal-to-noise ratios. A variety of equations are set forth above for approximating signal-to-noise ratio gain. With these equations, the method can iterate either over a target signal-to-noise ratio gain due to ARQ or over the number of transmissions allowed. The equations may flexibly be applied to iterate in a variety of ways. At each step in the iteration, the relationship between the number of transmissions allowed and the signal-to-noise ratio gain is considered, including net signal-to-noise ratio gain. The net signal-to-noise ratio gain reaches a maximum value and then drops. This method need only determine approximately where the point of maxima is, to allow selection of an appropriate number of transmissions allowed parameter. What a variety of FEC parameters can be used, both the signal-to-noise ratio gain due to FEC and the signal-to-noise ratio gain due to ARQ can be taken into account. It is useful for the results of these calculations to be retrievable or accessible based on characteristic values for the number of effective subcarriers and the average signal-to-noise ratio across the effective subcarriers.

12. Additional Discussion: QAM Symbol Error Versus Bit Error

In multicarrier systems the digital information is transformed by the modem into an analog form that is essentially a set of sub-channels (bins). Each DMT symbol (a DMT symbol should not be confused with a RS symbol) bears information in the form of an array of zeroes and ones, consisting of several $b_i$-sized sub-arrays. Each sub-array corresponds to a QAM waveform representing a $2^{b_i}$-point constellation. A DMT symbol waveform is just the superposition of these QAM waveforms. The channel itself is characterized by $\{\gamma_i\}$ where $\gamma_i$ is the signal-to-noise ratio (SNR) at the $i^{th}$ carrier frequency. Although most DMT implementations constrain each $b_i$ to be an integer, there is no need for this restriction. However, it is convenient if each DMT symbol carries an integer number of bits.

Assuming that, as is common in DMT systems, equal error protection is applied, the quantity $b_i$ has to be determined from the following requirement: for each bin, the bit error rate should not exceed $p_b$ (the BER level prior to decoding and retransmission). However, the standard QAM error determination procedure, as discussed in J. Proakis, *Digital Communicating*, McGraw-Hill, New York, 1995, yields the QAM symbol error rate rather than the bit error rate required.

Let us introduce $\omega(\gamma_i, b_i)$, an average fraction of erroneous bits in an erroneous bi-sized QAM symbol. If $p_{QAM}(\gamma_i, b_i)$ is the symbol error rate then the bit error rate, for this symbol, is just $p_{QAM}(\gamma_i, b_i)\omega(\gamma_i, b_i)$. For a multicarrier system, one normally requires that in each bin:

$$p_{QAM}(\gamma_i, b_i)\omega(\gamma_i, b_i) \leq p_b, \quad (A.1)$$

where $p_b$ is given by the following equation:

$$p_b = 1 - \left(1 - W(t, K, k)\varepsilon_S^{\frac{1}{(t+1)k}}\right)^{1/\alpha} \quad (A.2)$$

To attain the best performance, $b_i$ should maximize the left hand side of Eq. (A.1).

While an expression for $p_{QAM}$ is well known from communication theory, for instance Proakis' book, an appropriate expression for $\omega(\gamma_i, b_i)$ has to be determined. The problem is formulated as follows: assuming that a b-sized bin is in error determine the average fraction of bits in error in such a bin, $\omega(\gamma,b)$. For practical purposes, we are interested in $\omega(\gamma,b)$ at sufficiently large SNR (i.e. far enough from the channel capacity value). In this case $\omega(\gamma,b)$ is essentially independent of $\gamma$, and the problem of computing $\omega(b)$ is purely geometrical, as described below.

Figure 2:
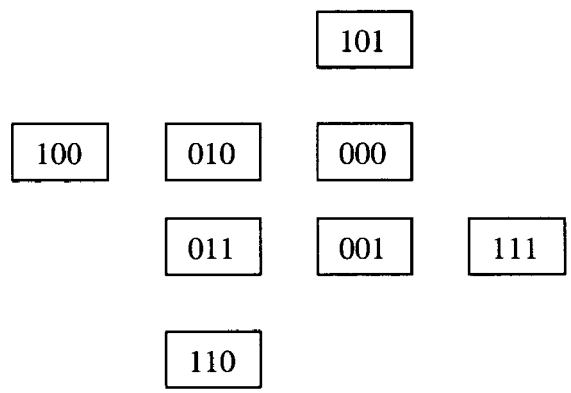
FIG. 2 shows an 8-point G.992.2 constellation.

Consider an arbitrary $2^b$ signal constellation on a square lattice (e.g. FIG. 2 shows the 8-point G.992.2 constellation). Let $a_i$ be the binary representation of the label for the $i^{th}$ point of the constellation. Let $\chi_i$ be the coordination number of this point, i.e. the total number of its nearest neighbors in the constellation. Then $\omega(b)$ is calculated by the following formula:

$$\omega(b) = \frac{1}{b \cdot 2^b} \sum_{i=1}^{2^b} \sum_{j \neq i}^{\chi_i} \frac{d_H(a_i, a_j)}{\chi_i} \quad (A.3)$$

Here $d_H(\bullet,\bullet)$ is the Hamming distance between two binary vectors, and the innermost summation in Eq. (A.3) is performed over the nearest neighbors of the point i.

For small b, computing $\omega(b)$ can be carried out manually. Table 12 shows some numbers for constellations used in the G.992.2 standard.

TABLE 12

Values of $\omega(b)$ Found from Eq (A.3).

| b | $\omega(b)$, Eq. (A.3) |
|---|---|
| 1 | 1 |
| 2 | 0.5 |
| 3 | 0.528 |
| 4 | 0.323 |
| 5 | 0.358 |
| 6 | 0.256 |

Results obtained using Eq. (A.3) can be compared with results of direct numerical simulations presented in Table 13.

TABLE 13

Values of $\omega(b)$ Found from Numerical Simulations.

| b | $\omega(b)$, simulations |
|---|---|
| 1 | 1 |
| 2 | 5.000000e−001 |
| 3 | 5.157480e−001 |
| 4 | 3.394366e−001 |
| 5 | 3.601190e−001 |
| 6 | 2.538012e−001 |
| 7 | 2.674897e−001 |
| 8 | 2.164009e−001 |
| 9 | 1.964286e−001 |
| 10 | 1.848450e−001 |
| 11 | 1.566952e−001 |
| 12 | 1.688679e−001 |
| 13 | 1.499222e−001 |
| 14 | 1.389728e−001 |
| 15 | 1.322208e−001 |

Figure 3:
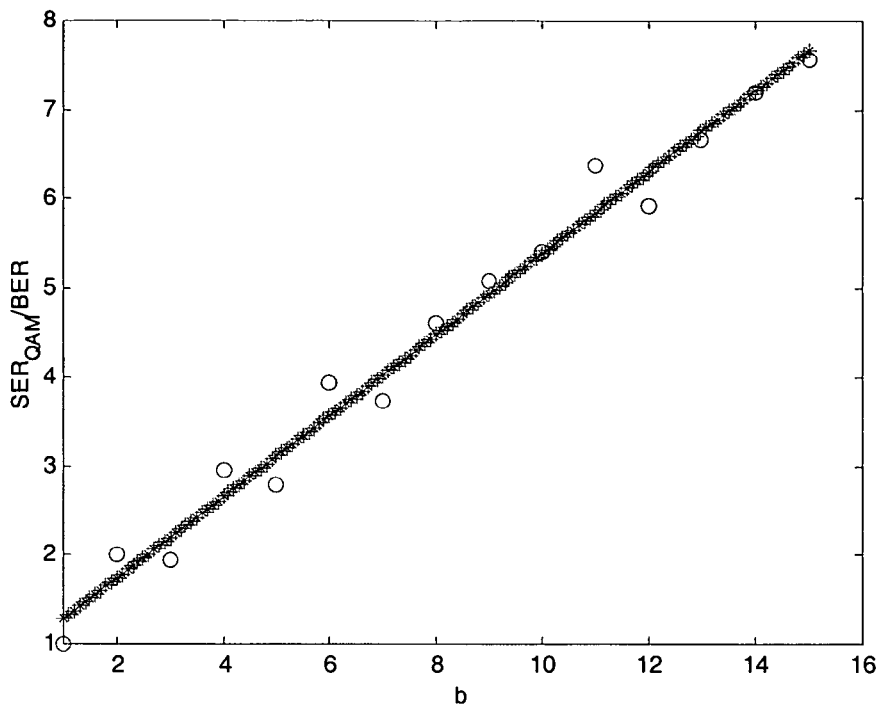
FIG. 3 shows $1/\omega(b)$ dependence from numerical simulations.
Figure 4:
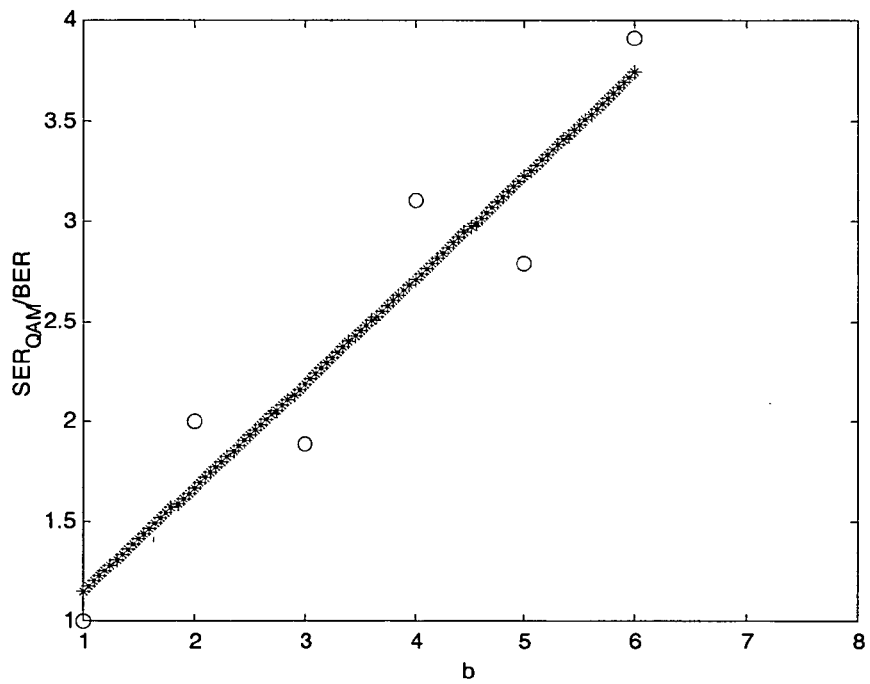
FIG. 4 shows $1/\omega(b)$ dependence from Eq. A.3.

Both approximation (A.3) and numerical simulations show that for G.992.2 constellations, $1/\omega(b)$ is well approximated by a linear function (FIGS. 2 and 3). Linear regression analysis of the $1/\omega(b)$ simulation data yields (FIG. 2):

$$1/\omega(b) = 0.46b + 0.83 \quad (A.4)$$

FIG. 3 shows $1/\omega(b)$ computed using Eq. (A.3) for G.992.2 constellations. Linear regression analysis of the $1/\omega(b)$ computed with Eq. (A.3) yields $$1/\omega(b) = 0.52b + 0.64 \quad (A.5)$$

Note that in both cases the quantity $\omega(b)$ is approximately 2/b at large b, for instance, for b greater than 6. One can see that the nearest-neighbor approximation of $\omega(b)$ by Eq. (A.3) is in a good agreement (within 5%) with results of numerical simulations. The small difference between the two cases is attributable to the effect of non-nearest neighbors.

Based on the above consideration, the following correlation will be used in this work:

$$1/\omega(b) = (2b+3)/4 \quad (A.6)$$

Eq. (A.6) yields the asymptotic behavior observed above (i.e., $\omega(b) \sim 2/b$ at large b). The choice of the free term in the numerator on the r. h. s. of Eq. (A.6) yields, among all $1/\omega(b)$ correlations of the kind of Eqs. (A.4) or (A.5), the best representation of $1/\omega(b)$ simultaneously at b=1 and b=2.

While the preceding examples are cast in terms of a method, devices and systems employing this method are easily understood. A magnetic memory containing a program capable of practicing the claimed method is one such device. A modem or pair of modems in communication with each other having memory loaded with a program practicing the claimed method are other such devices.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim:

1. A method of approximating a bit error rate applicable to a multicarrier communications channel, including:
measuring an average signal to noise ratio across effective subcarriers of the channel; and
analytically approximating a bit error rate from at least the average signal to noise ratio, an average bit loading of the effective subcarriers, and forward error correction and automatic repeat request parameters.

2. A method of approximating a signal to noise ratio gain resulting from application of an automatic repeat request protocol with a particular maximum number of transmissions allowed, to a forward error correction encoded multicarrier communications channel, including:
measuring an initial average signal to noise ratio across the effective subcarriers of the channel; and
analytically approximating a signal to noise ratio gain from at least the initial average signal to noise ratio, an average bit loading of the effective subcarriers, forward error correction parameters and a parameter for the particular maximum number of transmissions allowed.

3. A method of selecting communication parameters to be applied to a multicarrier communications channel, including:
measuring an initial signal to noise ratio across effective subcarriers of the channel;
accessing previously recorded analytical approximations of one or more bit error rates resulting from application of one or more communication parameters to a range of signal to noise ratios including the measured initial signal to noise ratio, wherein the previously recorded analytical approximations derived from:
selecting a range of signal to noise ratios applicable to the effective subcarriers of the channel;
selecting a set of alternative communication parameters describing an average bit loading of the subcarriers and forward error correction and automatic repeat request handling; and
analytically approximating a bit error rate for the range of SNRs and the set of alternative communication parameters; and
selecting the communication parameters to be applied based at least in part on the measured initial signal to noise ratio and the previously recorded analytical approximations.

4. The method of claim 3, wherein the approximations are recorded as splines.

5. The method of claim 3, wherein the approximations are recorded as interpolation tables.

6. A method of selecting communication parameters to be applied to a multicarrier communications channel, including:
measuring an initial signal to noise ratio across effective subcarriers of the channel;
accessing previously recorded analytical approximations of one or more signal to noise ratio gains resulting from application of one or more communication parameters to a range of signal to noise ratios including the measured initial signal to noise ratio, wherein the previously recorded analytical approximations derived from analytically approximating a signal to noise ratio gain from at least an initial signal to noise ratio, an average bit loading of the effective subcarriers, forward error correction parameters and a parameter for the particular maximum number of transmissions allowed; and
selecting the communication parameters to be applied based at least in part on the previously recorded analytical approximations.

7. The method of claim 6, wherein the approximations are recorded as splines.

8. The method of claim 6, wherein the approximations are recorded as interpolation tables.

9. A method of selecting forward error correction parameters for use in a communications session having multiple communications channels, including the steps:
measuring an average signal to noise ratio of effective subcarriers of the channel and counting the effective subchannels to be loaded with data; and
selecting from stored communication parameters associated with predicted net signal to noise ratio gains for the communication parameters, wherein the predicted net signal to noise ratio gains were previously derived at least for pairs of forward error correction parameters S and R/S across a range of average signal to noise ratios and a range of number of effective subcarriers to be loaded with data bits, wherein S is the number of symbol sets per codeword and R/S is a number redundancy symbols per codeword divided by S.

10. The method of claim 9, wherein the predicted net signal to noise ratio gains are recorded as splines.

11. The method of claim 9, wherein the predicted net signal to noise ratio gains are recorded as interpolation tables indexed by the measured initial signal to noise ratio and a count of the effective subcarriers.

* * * * *